(12) United States Patent  (10) Patent No.: US 8,185,716 B2
Skerlj et al.  (45) Date of Patent: May 22, 2012

(54) MEMORY SYSTEM AND METHOD FOR USING A MEMORY SYSTEM WITH VIRTUAL ADDRESS TRANSLATION CAPABILITIES

(75) Inventors: Maurizio Skerlj, Munich (DE); Paolo Ienne Lopez, Lausanne (CH)

(73) Assignee: Qimonda AG, Munich (DE)

( * ) Notice: Subject to any disclaimer, the term of this patent is extended or adjusted under 35 U.S.C. 154(b) by 794 days.

(21) Appl. No.: 11/876,373

(22) Filed: Oct. 22, 2007

(65) Prior Publication Data

US 2009/0106507 A1  Apr. 23, 2009

(51) Int. Cl.
*G06F 12/00*  (2006.01)
(52) U.S. Cl. ...................................................... 711/203
(58) Field of Classification Search .......................... None
See application file for complete search history.

(56) References Cited

U.S. PATENT DOCUMENTS

| | | | |
|---|---|---|---|
| 6,442,666 B1 | 8/2002 | Stracovsky | |
| 6,874,077 B2* | 3/2005 | Lyon | 711/207 |
| 2002/0078308 A1* | 6/2002 | Altman et al. | 711/147 |
| 2004/0107321 A1* | 6/2004 | Altman et al. | 711/147 |
| 2009/0055596 A1* | 2/2009 | Wallach et al. | 711/141 |

OTHER PUBLICATIONS

Bayer, R., et al., "Organization and Maintenance of Large Ordered Indices," Mathematical and Information Sciences Report 20, Jul. 1970, pp. 107-141, Boeing Scientific Research Laboratories.
Comer, D., "The Ubiquitous B-Tree," Computing Surveys, Jun. 1979, pp. 121-137, vol. 11, No. 2, ACM.
Cvetanovic, Z., et al., "Performance Characterization of the Alpha 21164 Microprocessor Using TP and Spec Workloads," Second International Symposium on High-Performance Computer Architecture, Feb. 1996, 11 pages.
DeWitt, D. J., et al., "Parallel Database Systems: The Future of Database Processing or a Passing Fad?," Sigmod Record, Dec. 1990, pp. 104-112, vol. 19, No. 4.
Hennessy, J.L., et al., "Computer Architecture: A Quantitative Approach," 1990, pp. 448-457, Chapter 5.10, Morgan-Kaufman, San Mateo, Ca.
JEDEC standard, "Definition of the SSTU32S869 & SSTU32D869 Registered Buffer with Parity for DDR2 RDIMM Applications," JESD82-12, Nov. 2004, pp. 1-24, JEDEC Solid State Technology Associations, Arlington, VA.
Mehta, M., et al., "Data Placement in Shared-Nothing Parallel Database Systems," The VLDB Journal, 1997, 20 pages, Springer-Verlag.
Pramanik, S., et al., "Parallel Processing of Large Node *B*-Trees," IEEE Transactions on Computers, Sep. 1990, pp. 1208-1212, vol. 39, No. 9, IEEE.
Seeger, B., et al., "Multi-Disk B-trees," pp. 436-445, 1991, ACM.
Vogt, P., "Fully Buffered DIMM (FB-DIMM) Server Memory Architecture: Capacity, Performance, Reliability, and Longevity," Intel Developer Forum, Feb. 18, 2004, pp. 1-33.

* cited by examiner

*Primary Examiner* — Brian Peugh
(74) *Attorney, Agent, or Firm* — John S. Economou

(57) ABSTRACT

A memory system comprises a first memory having associated therewith a first local memory access controller configured to access the first local memory using physical memory addresses and a second memory having associated therewith a second local memory access controller configured to access the second local memory using physical memory addresses. A global controller coupled to the first and second local controllers is configured to communicate virtual memory addresses to the first and second local memory controllers.

19 Claims, 5 Drawing Sheets

MEMORY SYSTEM AND METHOD FOR USING A MEMORY SYSTEM WITH VIRTUAL ADDRESS TRANSLATION CAPABILITIES

TECHNICAL FIELD

Embodiments of the invention relate to memory arrangements and memory access methods allowing to make use of virtual address translation capabilities embedded in the memory system.

BACKGROUND

A virtual memory system is one which allows addressing of very large amounts of memory, even though the main memory of the system encompasses a smaller address space. Virtual memory systems provide this capability by defining memory management units, in particular, pages or segments, have virtual memory address and corresponding physical memory addresses. A particular virtual memory address may be in main memory or in slower alternate memory, such as disk space. If a virtual address maps to a physical address of data is main memory, the information is readily accessed and utilized. If the physical address indicates that the page corresponding to the virtual address is located in the alternate memory, the page is transferred or swapped into main memory where the data can be accessed. The transfer typically necessitates that other information be swapped out of main memory back to the alternate memory to make room for the new information. This transfer is typically performed under the control of the memory management unit as either hardware or software.

BRIEF DESCRIPTION OF THE DRAWINGS

Several embodiments of the present invention will in the following be discussed, referencing the enclosed figures, wherein.

DETAILED DESCRIPTION OF ILLUSTRATIVE EMBODIMENTS

Figure 1:
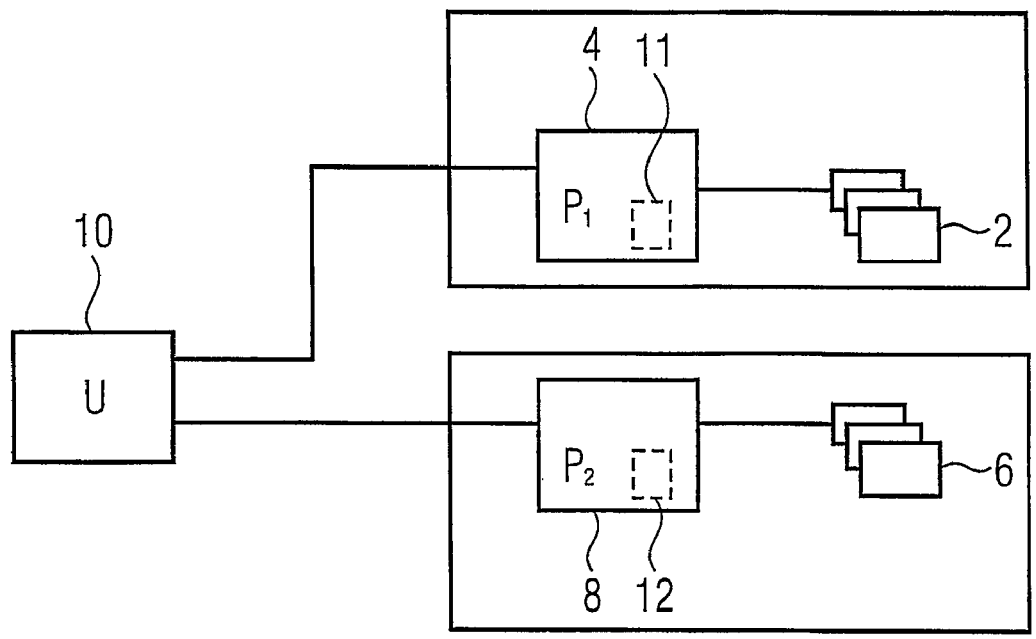
FIG. 1 shows an embodiment of a memory system.

FIG. 1 shows an embodiment of a memory system, comprising a first memory 2 having associated therewith a first local memory access controller 4, configured to access the first local memory using physical memory addresses. A second memory 6 having associated therewith a second local memory access controller 8 is configured to be accessed using physical memory addresses. The memory system furthermore comprises a global controller 10 coupled to the first and the second local memory access controllers 4 and 8 and which is configured to communicate the virtual memory addresses to the first and second local memory controllers. It should be noted that the first ($P_1$) and second ($P_2$) local memory controllers 4 and 8 serve as two examples for local memory controllers $P_i$, with i being a natural number $\geq 2$.

That is, FIG. 1 shows a scenario, in which virtual address translation capabilities are embedded in the memory subsystem of the first and second memories 2 and 6 and in particular within their associated local memory access controllers 4 and 8. The local memory access controllers may, for example, be advanced memory buffers, used in modern DRAM memory modules or the like. Not only physical memory addresses but also virtual memory addresses can be communicated to the first and second local memory controllers 4 and 8. The local memory access controllers have the capability of performing a virtual address translation using, for example, page tables or transfer look-aside buffers 11 and 12.

In other words, the embodiment of a memory system shown in FIG. 1 allows for a distributed management of the virtual addresses used in a computing system. In the memory system, the global controller 10 can access the memories 2 or 6 by issuing a memory access request (and optional transmitting data to be written) to the first and/or second local memory access controllers 4 and 8. In this request, the memory areas to be accessed are referenced by their physical addresses. The local memory access controller thus accesses the associated memory using the physical address. In the case of a read command issued from the global controller 10, the local memory access controllers 4 and/or 8 send the data read from the memory 2 or 6 to global controller 10.

In an alternative access scenario, the global controller 10 may communicate or send virtual memory addresses to the first and second local memory access controllers 4 and 8. The local memory access controllers 4 and 8 use their address translation capabilities (e.g., by using associated page tables or translation look-aside buffers) to translate the virtual address into the physical address required to physically access the associated memory.

In one embodiment, the individual local memory access controllers 4 and 8 only have access to translation information for those physical memory addresses which correspond to the locally connected memory elements. That is, local memory access controller 4 only knows how to translate virtual addresses to the physical addresses of memory 2 and local memory access controller 8 only knows how to translate virtual addresses for the memory elements of memory 6.

To keep the address translation consistent within the system, the memory access controller may, in several embodiments, further be configured to receive memory translation information indicating the association of a physical memory address to a virtual memory address. This information may, for example, be provided by the global controller 10, which is, for example, a memory controller of a conventional computer system. This may, for example, be a memory controller chip on a motherboard or a memory controller implemented within a CPU.

Summarizing, FIG. 1 shows a hardware configuration that allows to transfer a part or all of the virtual address translation capabilities in the memory subsystem by using embodiments of the previously described local memory access controllers.

Generally speaking, a local memory access controller may also be seen as a kind of coprocessor (especially when the local memory access controller has the capability of fulfilling also tasks beyond simple memory access) and the global memory controller may be seen as a master processor (M) distributing memory access requests using physical addresses as well as virtual addresses, the virtual addresses originating, for example, from a software program running in the environment of the master processor. In the following discussion, the terms global controller and master processor shall therefore be used synonymously. Moreover, the terms local memory access controller and coprocessor shall be used synonymously.

Since not only the operating system and the master processor (global controller 10) have knowledge of the association of virtual addresses to physical addresses (i.e., address translation capabilities), simple tasks can be distributed to coprocessors $P_i$, for which a memory access has to be performed. This reduces the load on the memory bus connecting the master controller or main processor 10 and the local memory access controllers or coprocessors $P_i$.

Figure 2:
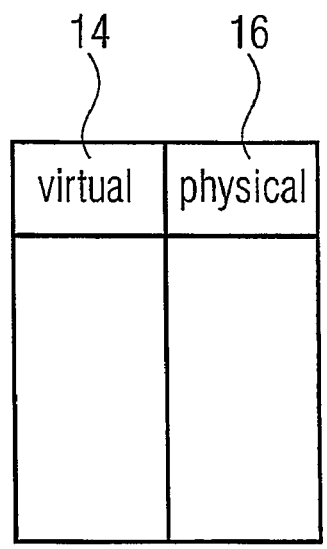
FIG. 2 shows an example of an address translation table.

Discussing the memory system of FIG. 1 in terms of the terminology master processor and coprocessors, the example of FIG. 1 allows translating virtual addresses in any coprocessor $P_i$, while the master processor M can still access the main memory directly by using physical addresses. In order to translate virtual memory addresses, the coprocessors $P_i$ may implement page tables $PT_i$ as, for example, shown in FIG. 2. The page tables $PT_i$ may be associated by translation look aside buffers $TLB_i$. A page table as depicted in FIG. 2 is used to translate the virtual page numbers (virtual addresses) to the physical addresses of the memory space assigned to $P_i$. FIG. 2 shows an example for such a page table PT, which is a associative list of virtual addresses 14 and associated physical addresses 16. The list is searched by the coprocessors $P_i$, i.e., by the local memory access controllers 4 and 8, in order to find the physical addresses associated with a transferred virtual address, which is sent by the main processor or the global access controller 10. As previously mentioned, such a page table is just an example for possible alternative algorithms, which may be used to translate a virtual to a physical address.

As it will become apparent from the following considerations, a memory system as depicted in FIG. 1 allows, for example, a highly efficient database implementation, since the coprocessors $P_i$ (the local memory access controllers) can be utilized to perform simple database queries or sub-queries.

This becomes feasible using further embodiments of memory systems. The capability of translating virtual addresses is required in managing typical data structures of databases, such as, for example, B-trees and its derivatives, which may be used in database management systems. However, if virtual address translation capabilities are transferred to the memory subsystem, some embodiments of the memory systems may be used to enhance the performance in database processing and for database queries. This is especially the case as database queries are characterized by subsequent memory accesses to arbitrary memory locations, which are not ordered sequentially or ordered in a somewhat predictable manner. When transferring database functionalities and distributing virtual address translation capabilities into the memory subsystem, the memory allocation and task scheduling functions may still be centralized in the master processor M, which may be seen as a global controller scheduling the memory access. In modern CPUs, the memory controller is often embedded within the CPU silicon.

Each database query or operation may be analyzed by M, which breaks it into subtasks or subqueries to be performed by the coprocessors $P_i$ using the very portion of the main memory space $D_i$ attached to it. In that sense, the main memory space accessible from M is constituted by the sum of all the memory subspaces $D_i$ (in this particular example, the memories 2 and 6), while each coprocessor $P_i$ (local memory access controllers 4 and 8) accesses its assigned memory subspace $D_i$, to which it has direct physical access using physical memory addresses.

In such a system, a main processor 10 may be any state-of-the-art processor optimized for any application where high-performance is not limited by the memory access bandwidth, which is normally the case in database applications. The master processor M may access the main memory transparently using physical addresses or it may issue database queries to the processors $P_i$ embedded in the memory subsystem. These access the memory independently to perform the query and store the results in the main memory, i.e., particularly in the memory portions $D_i$ associated to the coprocessors $P_i$. The result of the subquery may, for example, be communicated to the master processor M by transmission of a pointer or a physical address to the root of a data structure storing the table of results, as it was created while processing the subquery. The master processor may access the result table (or numerous partial result tables of numerous coprocessors $P_i$) and commit the query by writing it to an external memory or by combining all partial result tables of the coprocessors $P_i$ in a single result table.

As the master processor or the global controller 10 schedules memory allocation, it is favorable that the virtual address translation tables of the master processor 10 and the coprocessors 4 and 8 are kept consistent. The master processor 10 may perform a write operation for data associated by a virtual address, writing directly into the memory space 2 of local memory access controller 4. The local memory access controller 4 may then receive association information indicating an association of the physical address of the memory location to which the data has been stored and its corresponding virtual address in the address space of the application (the database application).

When implementing a delocalized database processing, the master processor M may be used to analyze the database commands and to break the database structures into substructures which are be managed by the coprocessors $P_i$. This may be performed using a load-balancing algorithm. The master processor M may then translate or transform each query to a number of subqueries, which can be performed on the substructures of the database. To promote a database subquery to the coprocessors $P_i$, M calculates the virtual address of the root page of the data structures (from now on it shall be assumed that the data structure is a B-tree) and then sends the subqueries to the relevant processors $P_i$, which own the memory subspace $D_i$ in which the substructures are stored or have been stored. The root page of the associated data structure means, in this scenario, a virtual address, which marks the beginning of a data structure (e.g., the B-tree) holding the data for the database subquery. Due to the internal organization of a B-tree structure, the transmission of the root page or the virtual address of the start of the B-tree is enough to fully reference the associated data, as subsequent leaves of the B-tree are pointing to each other. A memory area of predetermined size starting at a root address, i.e., the virtual address where the memory area begins, shall also be called a virtual page. The B-tree structure or substructure starts at a root address, wherein several pages (leaves) of the B-tree may be stored within the virtual page. When the global controller or the main processor 10 transmits a search query in association to the virtual memory address of the root page, the following 3 scenarios might occur.

The first scenario is that the virtual address is unknown to the coprocessor $P_i$ or the local memory access controller. That is, $P_i$ does not know how to translate the page number, i.e., the virtual address transmitted. The virtual address or the information associated to the virtual address (the B-tree pages) is not yet allocated to the memory space of $P_i$. To allow for a processing of the subquery by $P_i$, the associated B-tree information may therefore be gathered and transferred to the memory associated with $P_i$. This might be performed and scheduled by the master processor M, which needs to fetch the B-tree page from an external memory, such as from a hard disc. The master processor M then writes the page into the memory space of $P_i$, using physical memory addresses (i.e. a direct memory access). Thus, one of the two possibilities of addressing memory space of the local area memory controller is utilized, namely the transmission of physical memory addresses to write the information into the memory associated to the local area memory controller. However, in order to provide the possibility for further query-processing, the local memory access controller may receive translation information indicating the physical memory address associated to the virtual memory address of the B-tree page transferred to the memory of the local area memory controller. This may, for example, be achieved by a message of the master processor, which updates the page table of the local memory access controller.

The second scenario is a reference to a page with a known virtual address. That is, the local memory access controller knows how to translate the provided virtual address into a corresponding physical address. However, when traveling down the B-tree structure, it may occur that the B-tree page necessary to successfully answer the query is not known. This means that the B-tree page required belongs to a virtual page already known. For example, some B-tree pages belonging to the same virtual page have already been loaded into the memory, while the B-tree page of particular interest is still missing. The missing page could be loaded from an external memory. This is, equivalently to the previously discussed scenario, performed under the control of the master processor or the global controller M, which fetches and writes the page into the memory space associated to the coprocessor P (the local memory access controller). At the transfer to the memory, the global controller 10 updates or forces the local memory access controller to update its page table.

The third scenario is that the virtual address is known, i.e., existent in a page table of the local memory access controller and that the required B-tree page is already present within the memory space of the local memory access controller $P_i$. Then, the local memory access controller or the coprocessor $P_i$ can process the subquery provided by the local controller 10 without any further involvement of the global controller.

When implementing database queries, the result of a query is a table and may, therefore, use the same data structure as the database (i.e., a B-tree). The result of the subquery could, for example, be communicated to M by sending a message to the global controller, requiring the global controller M to allocate a memory, in which the local memory access controller can store the result of the processed query. Each of the local memory access controllers (coprocessors) may thus build the (partial) result table containing the entries of the substructure matching the subquery.

Once the memory space of the result table has been directly allocated by the global controller, the global controller may read out the partial results by directly assessing the partial tables using the physical addresses of the allocated memory. Thus, the global controller can collect all information to combine the partial results and to commit the result of the query by writing the result in an external memory or by communicating the result in an appropriate manner.

Alternatively, a memory area of appropriate size may be allocated by the coprocessor itself and, at least, the physical address of the start of the allocated memory area may be communicated to the main processor 10.

Figure 3:
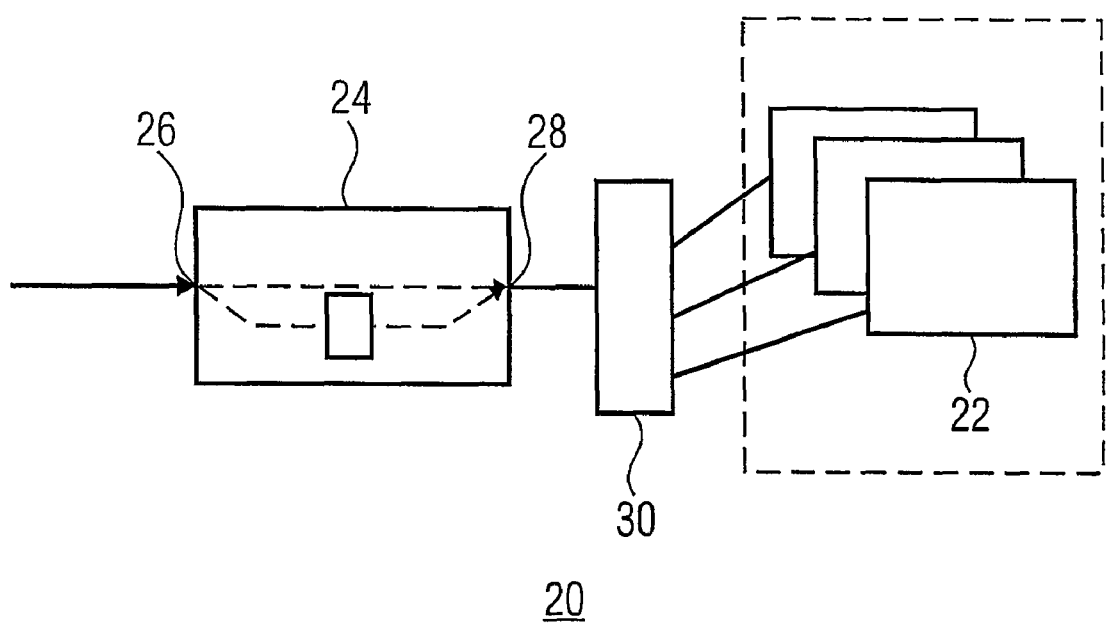
FIG. 3 shows an embodiment of a memory arrangement.

FIG. 3 illustrates an embodiment of a memory arrangement 20 with memory 22, accessible using physical memory addresses. The memory arrangement 20 comprises a memory access controller 24, which is capable of receiving, at an input 26, on the one hand physical memory addresses and, on the other hand virtual memory addresses from a global controller.

The memory access controller 24 is further configured to translate the received virtual memory addresses to associated physical memory addresses, such as to provide physical memory addresses at an output 28, which may be further processed by a memory interface 30. The memory interface 30 is used to physically access the memory 22 using the physical memory address provided by the local memory access controller 24.

That is, in the memory arrangement 20, the local memory access controller 24 does, on the one hand, forward received physical memory addresses to the memory interface 30. On the other hand, the local memory access controller offers memory address translation capabilities to also process requests having virtual memory addresses. That is, a global controller may make use of the memory arrangement in two different ways. The global controller can address the memory using physical memory addresses, i.e., address the memory transparently (a virtual to physical memory address translation could already have taken place within the global controller or within the CPU/operating system). The global controller could furthermore access the memory using virtual memory addresses. Such, further requests may be sent to the local memory access controller using the virtual memory addresses of a software running on the CPU.

The local memory access controller 24 could, for example, be implemented on the printed circuit board of the memory 22. That is, for example, DRAM modules may be designed, carrying the local memory access controller and the memory interface 30 together with memory 22 on a single DIMM. However, the memory interface 30 and the local memory access controller 24 could also be physically separated, as, for example, attached to different ends of a memory bus. Embodiments of the invention may comprise local memory access controllers implemented within the CPU itself or within a global controller, used to schedule memory access within the system. For example, a memory controller implemented on a mother board of a computer system may be equipped with a local memory access controller implementing the previously described functionality, whereas the memory interface may be implemented on the memory elements or DIMMs used in the system.

Figure 4A:
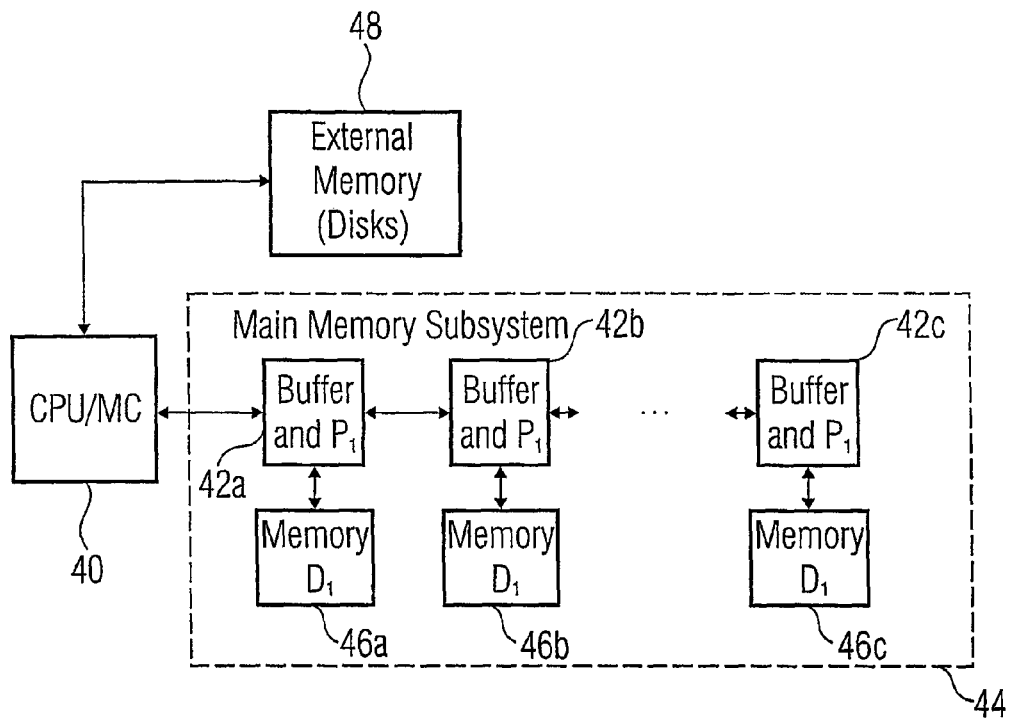
FIG. 4a shows an embodiment of a memory system.
Figure 4B:
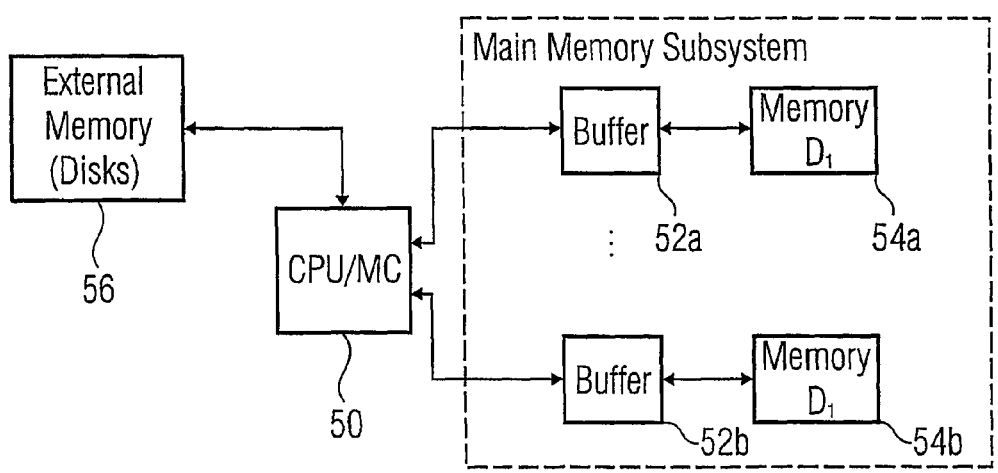
FIG. 4b shows a further embodiment of a memory system.

FIGS. 4a and 4b illustrate further embodiments for implementing the previously described functions and for utilizing local memory access controllers capable of translating virtual to physical addresses. For example, the above mentioned functions may be integrated in memory buffers needed for signal integrity issues imposed by the high data rates achieved within recent years. The example referred to in FIG. 4a is the fully buffered DIMM (FB-DIMM) architecture, in which each DIMM hosts a buffer, the so-called "advanced memory buffer" (AMB). In a first possible arrangement, a CPU 40 and advanced memory buffers 42a-42c are connected in a daisy chain fashion within a memory subsystem 44. Each advanced memory buffer 42a-42c has its associated local memory 46a-46c, wherein the advanced memory buffer and the associated memory are normally located on the same DIMM. The first DIMM in the channel hosts advanced memory buffer 42a, which is connected to the processor 40 (or to a global memory controller).

Since each advanced memory buffer or memory buffer 42a-42c is physically connected to the DRAMs (memories 46a-46c) on the DIMM, the total memory space is made by the sum of all the DRAMs in the system, while each advanced memory buffer 42a-42c has access only to the DRAMs on the same DIMM or, in more general terms, each advanced memory buffer 42a-42c has access to its locally associated memory 46a-46c. The memory space is, therefore, physically partitioned.

All the advanced memory buffers 42a-42c dialogue with the central processor via a high speed link, designed for sequential or parallel data transfer. The CPU or the global controller 40 does furthermore have access to an external memory 48, which may, for example, be a hard disc, a network storage location, optical or magnetic data storage devices, such as tapes or DVDs or the like. When implementing the local data base query option previously discussed, the CPU 40 or the global controller 40 may, for example, use the external memory 48 to transfer data, not already present in the memories 46a-46c to the individual memories, upon request of the associated advanced memory buffer or local memory access controller 42a-42c.

FIG. 4b shows a further embodiment in which a processor or memory controller 50 is connected to a plurality of memory buffers 52a-52b in parallel, wherein each memory buffer 52a or 52b manages its associated memory 54a or 54b. As previously described, the processor 50 may furthermore have access to an external memory 56.

FIGS. 4a and 4b show two alternative possibilities of memory systems implementing embodiments of local memory access controllers. However, the application of the inventive concept is not limited to those two particular examples of memory subsystems. As it goes without saying, further combinations or access scenarios are possible, i.e., a combination of the two architectures of FIGS. 4a and 4b is feasible. That is, parallel access may be combined with daisy chaining.

Figure 5:
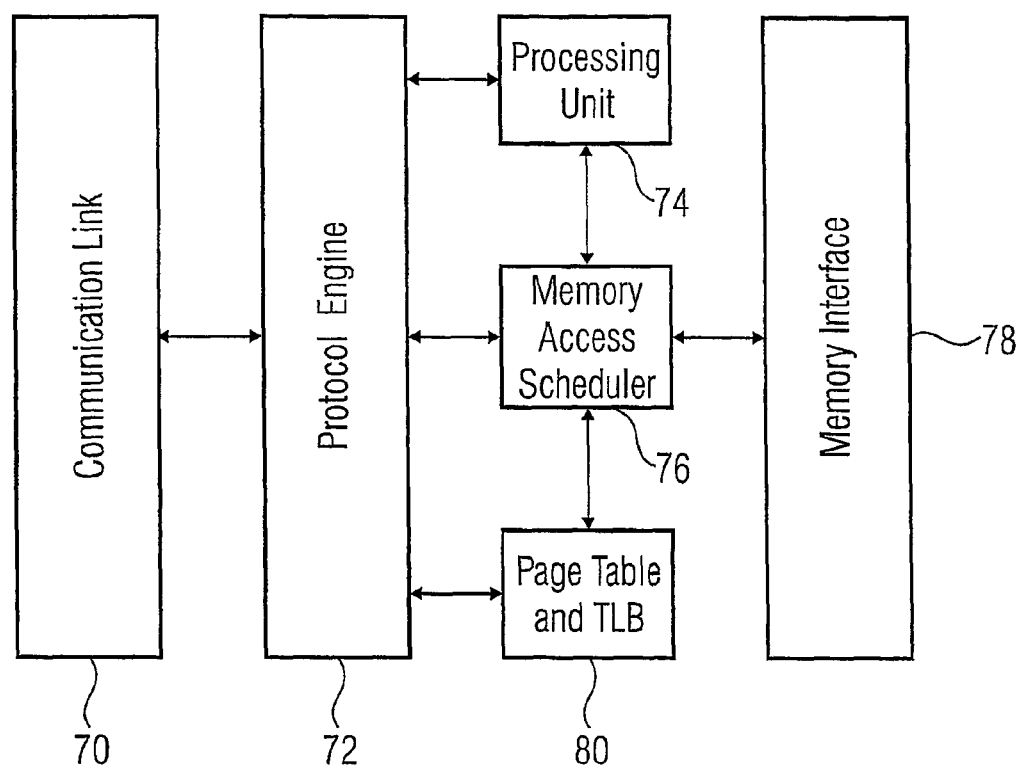
FIG. 5 shows an embodiment of a local memory access controller.

FIG. 5 shows an embodiment of a memory buffer or local memory access controller, as it may be used within the systems of FIG. 4a or 4b. A communication link 70 is configured to receive the physical communication, i.e., to receive bus-signals, clock signals, command signals and the like. The received signals are furthermore evaluated by a protocol engine, which is, on the one hand, coupled to a processing unit 74 and, on the other hand, to a memory access scheduler 76. When the protocol engine 72 receives a physical memory address associated with a write or read command or other access commands, it may forward the associated commands to the memory access scheduler 76 directly, which is coupled to a memory interface 78 used to physically connect to the main memory, i.e., which physically generates the signals used to access the memory as, for example, clock signals and the like. Whenever the protocol engine 72 receives instructions not related to a direct memory access using physical memory addresses, those instructions are forwarded to the processing unit 74. These instructions may, for example, indicate the above-mentioned data based processing functions (for example, search, select, order, etc.).

As these commands may reference virtual memory addresses, address translation elements 80 such as, for example, a page table and a translation look-aside buffer, may be connected to the memory access scheduler 76 which may send a translation request of a virtual address to the address translation elements 80, such as to receive the associated physical address. So to say, the scheduler manages the memory accesses coming from a master processor M (using physical memory addresses) and the memory accesses locally generated by the processing of the queries (using virtual memory addresses). This allows for an integration of the previously described functionalities in an advanced memory buffer or the like.

Figure 6:
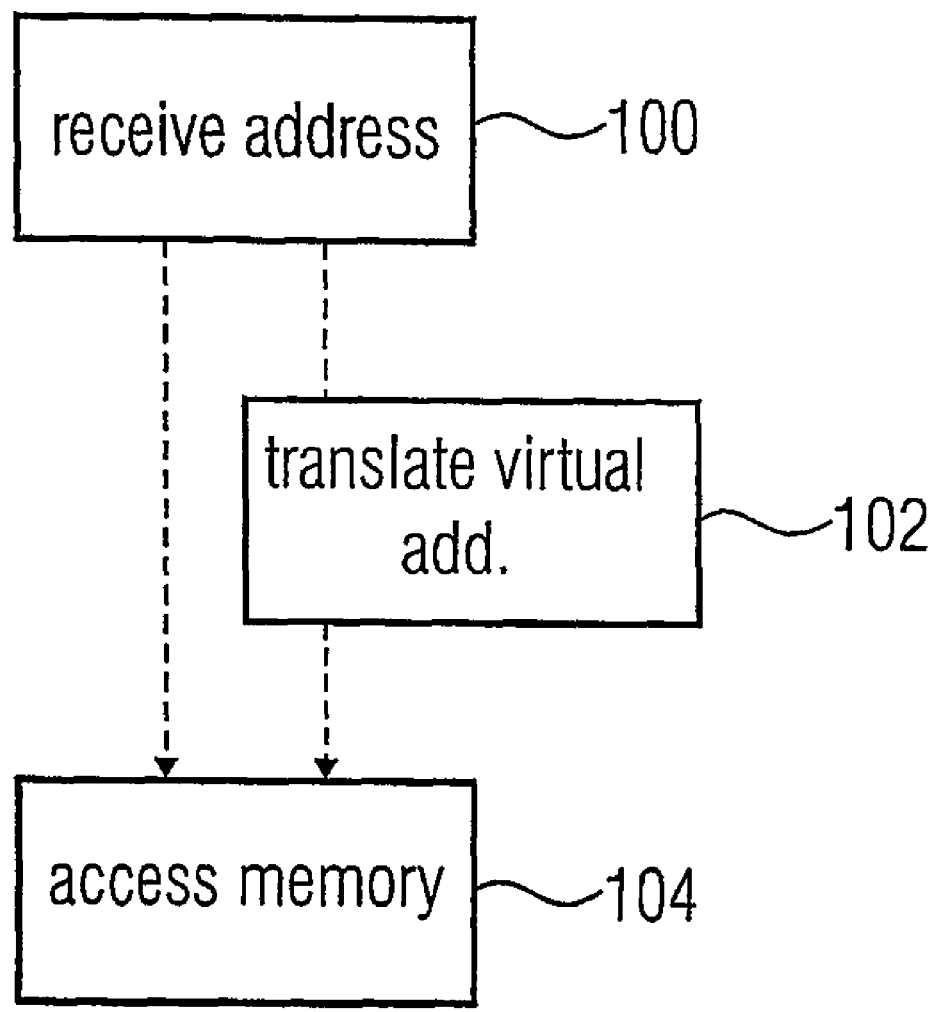
FIG. 6 shows an embodiment of an inventive method for accessing a physical memory.

FIG. 6 shows an embodiment of a method for accessing memory.

In a first receiving step 100, physical memory addresses and virtual memory addresses are received from a global controller. In a translation step 102, the received virtual memory addresses are translated to their associated physical memory addresses, wherein the received physical memory addresses are maintained.

In a memory access step 104, the memory is accessed using the physical memory addresses regardless whether virtual or physical memory addresses had been provided by the global controller.

Although in the previously described embodiments of the present invention, no specific implementation has been disclosed as to how the local memory access controllers make the decision, whether a received address has to be translated or not, all possible decision strategies may be used in further embodiments of the invention. For example, the local memory access controller may take the decision itself, based on the memory-address-format received. Alternatively, memory translation information may be provided within the command, indicating whether the address should be translated or not. This translation information may, for example, be an additional bit within the memory access protocol or provided on a separate bit line.

The local memory access controller previously described may be configured to receive the memory addresses from a global access controller, which is implemented in hardware. That is, the signals input into the local memory access controller may be bit lines of a data bus, configured to carry address information, command information and the like.

The local memory access controller may furthermore be accompanied by an associated memory, which is configured to store a page table. Alternatively, the local memory access controller may use part of the memory of the DRAM to store the page table.

It has been indicated in some embodiments, that the master processor or the global controller may send search queries. The local controllers or coprocessors are therefore capable of processing those search queries. In that context, the term search query is not to be understood to be limited to generic search operations only. It should be understood that also other database processing queries, such as, for example, Join, Order or Update commands may be transferred or received, when referring to search queries. In other words, the term search query shall also be understood as Join, Order or Update Query or command.

In order to keep the virtual to physical memory access translation within a whole memory subsystem consistent, the local memory access controller may furthermore be capable of communicating information and control data or messages to the global controller (the CPU or the like). For example, messages may indicate that a translation of the virtual address could not be performed, that is, for example, that the association of the virtual address to the physical address is not stored within the page table or the translation look-aside buffer of the local memory access controller. Furthermore, the local memory access controller may also send a message to make the global controller write content into the memory associated to the local memory access controller. To this end, the local memory access controller could also send a message making the global controller allocate memory within the memory space of the local memory access controller and to force an update of the associated page tables/TLBs.

Depending on certain implementation requirements, further embodiments of methods for accessing data can be implemented in hardware or in software. The implementation can be performed using a digital storage medium, in particular a disk, DVD or a CD having electronically readable control signals stored thereon, which cooperate with a programmable computer system such that embodiments of the methods are performed. Generally, some embodiments can, therefore, be a computer program product with a program code stored on a machine readable carrier, the program code being operative for performing embodiments of methods for accessing data when the computer program product runs on a computer. In other words, some embodiments are, therefore, a computer program having a program code for performing at least one of the methods when the computer program runs on a computer.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehended by the claims that follow.

What is claimed is:

1. A memory arrangement with memory accessible using physical memory addresses, the memory arrangement comprising:
a local memory access controller configured to receive physical memory addresses and virtual memory addresses from a global controller, the local memory access controller further configured to translate the received virtual memory addresses to associated physical memory addresses; and
a memory interface for accessing the memory using the physical memory addresses.

2. The memory arrangement in accordance with claim 1, wherein the local memory access controller is further configured to receive memory translation information indicating an association between a physical memory address and a virtual memory address.

3. The memory arrangement in accordance with claim 1, wherein the memory access controller is further configured to receive a translation requirement signal, indicating whether a received address shall be translated.

4. The memory arrangement in accordance with claim 3, wherein the translation requirement signal comprises a signal bit or a bit sequence transmitted on one or more bit lines.

5. The memory arrangement in accordance with claim 1, wherein the local memory access controller further comprises a translation look-aside buffer configured to contain virtual memory addresses and their associated physical memory addresses.

6. The memory arrangement in accordance with claim 1, wherein the local memory access controller comprises a memory configured to store a page table.

7. The memory arrangement in accordance with claim 1, wherein the local memory access controller is further configured to communicate to the global controller, when a translation of the virtual address was unsuccessful.

8. The memory arrangement in accordance with claim 1, wherein the local memory access controller is further configured to transfer data stored at a received physical memory address to the global controller.

9. The memory arrangement in accordance with claim 1, wherein the local memory access controller is further configured to issue an allocation request to the global controller, indicating that the global controller shall allocate memory associated to the local memory access controller using physical addresses.

10. The memory arrangement in accordance with claim 1, wherein the local memory access controller is further operative to receive search queries in association with a virtual memory address.

11. The memory arrangement in accordance with claim 10, wherein the local memory access controller further comprises a query processor configured to answer search queries using data stored at the physical memory address associated to the transmitted virtual address.

12. The memory arrangement in accordance with claim 11, wherein the query processor is further configured to store result data of the answer of the search query in the memory associated to the local memory access controller.

13. The memory arrangement in accordance with claim 12, wherein the local memory access controller is further operative to communicate a physical address of a storage location of the result data to the global controller.

14. A method for accessing memory, the method comprising:
receiving physical memory addresses and virtual memory addresses from a global controller;
translating the received virtual memory addresses to associated physical memory addresses; and
accessing the memory using the physical memory addresses.

15. The method in accordance with claim 14, further comprising receiving memory translation information indicating an association between a physical memory address and a virtual memory address, the translating being based at least in part of the received memory translation information.

16. The method in accordance with claim 14, further comprising receiving a translation requirement signal, indicating that a received address must be translated.

17. The method in accordance with claim 14, further comprising communicating to the global controller when a translation of a virtual address was unsuccessful.

18. The method in accordance with claim 14, further comprising receiving search queries in association with a virtual memory address.

19. The method in accordance with claim 14, further comprising storing result data of an answer to the search query within the memory.

* * * * *